(12) United States Patent
Huang

(10) Patent No.: US 9,525,028 B1
(45) Date of Patent: *Dec. 20, 2016

(54) DUAL-WELL METAL OXIDE SEMICONDUCTOR (MOS) DEVICE AND MANUFACTURING METHOD THEREOF

(71) Applicant: RICHTEK TECHNOLOGY CORPORATION, Zhubei, Hsinchu (TW)

(72) Inventor: Tsung-Yi Huang, Hsinchu (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/066,207

(22) Filed: Mar. 10, 2016

(30) Foreign Application Priority Data

Feb. 2, 2016 (CN) .......................... 2016 1 0072078

(51) Int. Cl.
| | |
|---|---|
| H01L 21/8234 | (2006.01) |
| H01L 29/10 | (2006.01) |
| H01L 29/78 | (2006.01) |
| H01L 29/06 | (2006.01) |
| H01L 29/66 | (2006.01) |

(52) U.S. Cl.
CPC ....... *H01L 29/1083* (2013.01); *H01L 29/0684* (2013.01); *H01L 29/66492* (2013.01); *H01L 29/7836* (2013.01); *H01L 21/823493* (2013.01); *H01L 29/7816* (2013.01); *H01L 29/7835* (2013.01)

(58) Field of Classification Search
CPC .................. H01L 21/823493; H01L 29/7816; H01L 29/7835
USPC .................. 438/217, 218, 226, 228; 257/336
See application file for complete search history.

(56) References Cited

U.S. PATENT DOCUMENTS

| | | | |
|---|---|---|---|
| 7,989,889 B1* | 8/2011 | Kerr .................... | H01L 29/1045 257/335 |
| 2005/0006701 A1* | 1/2005 | Sung ............... | H01L 21/823814 257/339 |
| 2006/0027874 A1* | 2/2006 | Tsai .................... | H01L 29/7835 257/365 |
| 2006/0049452 A1* | 3/2006 | Tsai ...................... | H01L 29/086 257/328 |
| 2008/0237703 A1* | 10/2008 | Lin ................... | H01L 29/66659 257/336 |
| 2011/0266620 A1* | 11/2011 | Terrill ................... | H01L 21/743 257/343 |

(Continued)

*Primary Examiner* — George Fourson, III
(74) *Attorney, Agent, or Firm* — Tung & Associates

(57) ABSTRACT

A dual-well metal oxide semiconductor (MOS) device includes: a substrate, an epitaxial layer, a first conductive type well, a first conductive type body region, a second conductive type well, a gate, a first conductive type lightly doped diffusion (LDD) region, a second conductive type lightly doped diffusion (LDD) region, a second conductive type source, and a second conductive type drain. The second conductive type well is connected to the first conductive type well in a lateral direction, and an PN junction is formed between the second conductive type well and the first conductive type well. The MOS device includes LDD regions of opposite conductive types, each located in a corresponding well of a corresponding conductive type, to reduce the channel length.

10 Claims, 8 Drawing Sheets

(56) References Cited

U.S. PATENT DOCUMENTS

2013/0161750 A1\* 6/2013 Chen ................... H01L 27/0266
257/357
2014/0203358 A1\* 7/2014 Yang ................... H01L 29/7835
257/335

\* cited by examiner

US 9,525,028 B1

DUAL-WELL METAL OXIDE SEMICONDUCTOR (MOS) DEVICE AND MANUFACTURING METHOD THEREOF

CROSS REFERENCE

The present invention claims priority to CN 201610072078.3, filed on Feb. 2, 2016.

BACKGROUND OF THE INVENTION

Field of Invention

The present invention relates to a dual-well metal oxide semiconductor (MOS) device and a manufacturing method thereof; particularly, it relates to such a dual-well MOS device having a reduced conduction resistance and an increased breakdown voltage, and a manufacturing method thereof.

Description of Related Art

FIG. 1 shows a cross-section view of a prior art metal oxide semiconductor (MOS) device 100, which includes: a P-type substrate 101, an epitaxial layer 102, a P-type well 103, an isolation oxide region 104, N-type lightly doped diffusion (LDD) regions 105a and 105b, an N-type source 106, an N-type drain 107, a P-type body region 108, and a gate 111. The isolation oxide region 104 is formed by local oxidation of silicon (LOCOS), to define an operation region 104a which is a major operation region of the MOS device 100. The operation region 104a is indicated by the arrows shown in FIG. 1. The MOS device 100 is an NMOS device, wherein the N-type source 106 connects the N-type LDD region 105a which is at same side of the MOS device 100 as the N-type source 106, and the N-type drain 107 connects the N-type LDD region 105b which is at another side of the MOS device 100 and at same side as the N-type drain 107. The two aforementioned connected regions at two sides of the MOS device 100 are separated by the P-type well 103. Similarly, a prior art PMOS device has the same structure, except that the conductive type of the LDD regions 105a and 105b, the source 106, and the drain 107 are changed to P-type, while the conductive type of the well 103 and the body region 108 are changed to N-type. It is an important trend in the field of semiconductor device to reduce the device size; however, as the channel of the MOS device is shortened, a short channel effect (SCE) caused by drain-induced barrier lowering (DIBL) and hot carrier effect (HCE) will occur. The details of these effects are well-known by one skilled in the art, so they are not redundantly explained here.

As an example, when a gate operation voltage of the MOS device is 5V and the gate length is shorter than 0.6 µm, the SCE starts to occur. To avoid the SCE, the gate length cannot be shorter, unless some solution is proposed to solve this SCE effect. That is, an effective solution is required for an MOS device to be able to operate under certain given operation voltage, and integrated with other devices (or connected in parallel with other MOS devices of the same characteristics) in a circuit, without SCE, while with a reduced size.

In view of above, to overcome the drawbacks in the prior art, the present invention proposes a dual-well MOS device having a reduced conduction resistance and an increased breakdown voltage, and a manufacturing method thereof.

SUMMARY OF THE INVENTION

In one perspective, the present invention provides a dual-well metal oxide semiconductor (MOS) device. The dual-well MOS device includes: a substrate, including a top surface and a bottom surface opposite to the top surface in a vertical direction; an epitaxial layer, which is formed on and connects at least a portion of the top surface of the substrate, the epitaxial layer including an epitaxial top surface opposite to the top surface in the vertical direction; a first conductive type well, which is formed in the epitaxial layer and located under the epitaxial top surface in the vertical direction; a first conductive type body region, which is formed on the first conductive type well in the epitaxial layer, and is located between the first conductive type well and the epitaxial top surface in the vertical direction; a second conductive type well, which is formed in the epitaxial layer and located under the epitaxial top surface in the vertical direction, and connects the first conductive type well in a lateral direction, to form a PN junction between the first conductive type well and the second conductive type well; a gate, which is stacked on and connects the epitaxial top surface in the vertical direction; a first conductive type lightly doped diffusion (LDD) region, which is formed on the first conductive type well in the epitaxial layer, and is located between the epitaxial top surface and the first conductive type well in the vertical direction; a second conductive type lightly doped diffusion (LDD) region, which is formed on the second conductive type well in the epitaxial layer, and is located between the epitaxial top surface and the second conductive type well in the vertical direction; a second conductive type source, which is formed on the first conductive type well in the epitaxial layer, and is located between the epitaxial top surface and the first conductive type well in the vertical direction, wherein the second conductive type source connects the first conductive type body region and the first conductive type LDD region in the lateral direction; and a second conductive type drain, which is formed on the second conductive type well in the epitaxial layer, and is located between the epitaxial top surface and the second conductive type well in the vertical direction, wherein the second conductive type drain connects the second conductive type LDD region in the lateral direction; wherein, the PN junction is located between the first conductive type LDD region and the second conductive type LDD region.

In one perspective, the present invention also provides a manufacturing method of a dual-well metal oxide semiconductor (MOS) device. The manufacturing method includes: providing a substrate, which includes a top surface and a bottom surface opposite to the top surface in a vertical direction; forming an epitaxial layer, which is formed on and connects at least a portion of the top surface of the substrate, the epitaxial layer including an epitaxial top surface opposite to the top surface in the vertical direction; forming a first conductive type well, which is formed in the epitaxial layer and located under the epitaxial top surface in the vertical direction; forming a first conductive type body region, which is formed on the first conductive type well in the epitaxial layer, and is located between the first conductive type well and the epitaxial top surface in the vertical direction; forming a second conductive type well, which is formed in the epitaxial layer and located under the epitaxial top surface in the vertical direction, and connects the first conductive type well in a lateral direction, to form a PN junction between the first conductive type well and the second conductive type well; forming a gate, which is stacked on and connects the epitaxial top surface in the vertical direction; forming a first conductive type lightly doped diffusion (LDD) region, which is formed on the first conductive type well in the epitaxial layer, and is located between the epitaxial top surface and the first conductive type well in the vertical direction; forming a second conductive type lightly doped diffusion (LDD) region, which is formed on the second conductive type well in the epitaxial layer, and is located between the epitaxial top surface and the second conductive type well in the vertical direction; forming a second conductive type source, which is formed on the first conductive type well in the epitaxial layer, and is located between the epitaxial top surface and the first conductive type well in the vertical direction, wherein the second conductive type source connects the first conductive type body region and the first conductive type LDD region in the lateral direction; forming a second conductive type drain, which is formed on the second conductive type well in the epitaxial layer, and is located between the epitaxial top surface and the second conductive type well in the vertical direction, wherein the second conductive type drain connects the second conductive type LDD region in the lateral direction; wherein the PN junction is located between the first conductive type LDD region and the second conductive type LDD region.

In one preferable embodiment, the dual-well MOS device further includes an isolation oxide region. The isolation oxide region is formed on the epitaxial layer, to define an operation region, wherein the first conductive type body region, the gate, the first conductive type LDD region, the second conductive type LDD region, the second conductive type source, and the second conductive type drain are located in the operation region.

In one preferable embodiment, the isolation oxide region includes a local oxidation of silicon (LOCOS) structure or a shallow trench isolation (STI) structure.

In one preferable embodiment, an impurity concentration of the first conductive type LDD region is higher than an impurity concentration of the first conductive type well, and an impurity concentration of the second conductive type LDD region is higher than an impurity concentration of the second conductive type well.

In one preferable embodiment, the dual-well MOS device further includes a second conductive type buried layer, which is formed between the substrate and the epitaxial layer, the second conductive type buried layer upwardly connecting the first conductive type well in the vertical direction.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 2:
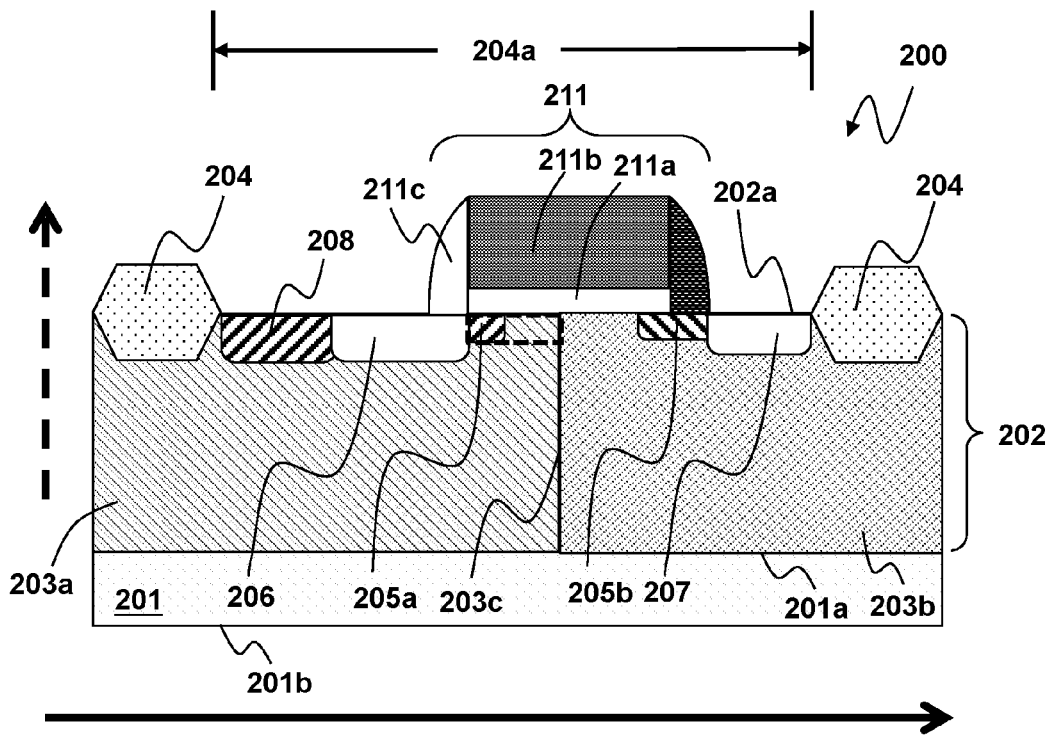
FIG. 2 shows a first embodiment of the present invention.

Please refer to FIG. 2 for a first embodiment according to the present invention, wherein FIG. 2 shows a cross-section view of a dual-well MOS device 200. The dual-well MOS device 200 includes: a substrate 201, an epitaxial layer 203a, a first conductive type well 203a, a second conductive type well 203b, an isolation oxide 204, a first conductive type lightly doped diffusion (LDD) region 205a, a second conductive type lightly doped diffusion (LDD) region 205b, a second conductive type source 206, a second conductive type drain 207, a first conductive type body region 208, and a gate 211.

In the first embodiment, when the first conductive type is P-type, the second conductive type is N-type; when the first conductive type is N-type, the second conductive type is P-type. The substrate 201 includes a top surface 201a and a bottom surface 201b opposite to the top surface 201a in a vertical direction (as shown by the dash arrow in the figure). The epitaxial layer 202 is formed on the substrate 201, i.e., the epitaxial layer 202 is stacked on and connects the top surface 201a of the substrate 201. The epitaxial layer 202 includes an epitaxial top surface 202a opposite to the top surface 201a. The first conductive type well 203a is formed in the epitaxial layer 202 and located under the epitaxial top surface 202a in the vertical direction.

The first conductive type body region 208 is formed on the first conductive type well 203a in the epitaxial layer 202; it is located between the first conductive type well 203a and the epitaxial top surface 202a in the vertical direction. The second conductive type well 203b is formed in the epitaxial layer 202 and located under the epitaxial top surface 202a in the vertical direction, and the second conductive type well 203b connects the first conductive type well 203a in a lateral direction (as shown by the solid arrow in the figure), to form a PN junction 203c between the first conductive type well 203a and the second conductive type well 203b. The gate 211 is formed on the epitaxial top surface 202a, i.e., it is stacked on and connects the epitaxial top surface 202a in the vertical direction. The gate 211 includes a dielectric layer 211a, a gate conductive layer 211b, and a spacer layer 211c. The dielectric layer 211a is formed on and connects the epitaxial layer 202a. The gate conductive layer 211b is formed on the dielectric layer 211a, and it includes a conductive material so as to form an electrical contact of the gate 211. The gate conductive layer 211b also functions as a self-aligned mask for forming the first conductive type LDD region 205a and the second conductive type LDD region 205b. The spacer layer 211c is formed on the epitaxial top surface 202a outside the side walls of the gate conductive layer 211b, enclosing the side walls of the gate conductive layer 211b. The spacer layer 211c includes an insulating material, and the spacer layer 211c also functions a self-aligned mask for forming the second conductive type source 206 and the second conductive type drain 207.

The first conductive type LDD region 205a is formed on the first conductive type well 203a in the epitaxial layer 202 by a self-aligned process. The first conductive type LDD region 205a is located between the epitaxial top surface 202a and the first conductive type well 203a in the vertical direction. The second conductive type LDD region 205b is formed on the second conductive type well 203b in the epitaxial layer 202 by a self-aligned process. The second conductive type LDD region 205b is located between the epitaxial top surface 202a and the second conductive type well 203b in the vertical direction. The second conductive type source 206 is formed on the first conductive type well 203a in the epitaxial layer 202. The second conductive type source 206 is located between the epitaxial top surface 202a and the first conductive type well 203a in the vertical direction. Further, the second conductive type source 206 connects the first conductive type body region 208 and the first conductive type LDD region 205a in the lateral direction. The second conductive type drain 207 is formed on the second conductive type well 203b in the epitaxial layer 202. The second conductive type drain 207 is located between the epitaxial top surface 202a and the second conductive type well 203b in the vertical direction, and the second conductive type drain 207 connects the second conductive type LDD region 205b in the lateral direction. A PN junction 203c is formed between the first conductive type LDD region 205a and the second conductive type LDD region 205b. The PN junction 203c electrically separate the first conductive type LDD region 205a and the second conductive type LDD region 205b in the operation region 204a.

The operation region 204a is defined by the isolation oxide region 204 formed on the epitaxial layer 202. The first conductive type body region 208, the gate 211, the first conductive type LDD region 205a, the second conductive type LDD region 205b, the second conductive type source 206, and the second conductive type drain 207 are located in the operation region 204a. In one preferred embodiment, the first conductive type LDD region 205a is only directly connected to the second conductive type source 206, the dielectric layer 211a, and the first conductive type well 203a; the second conductive type LDD region 205b is only directly connected to the second conductive type drain 207, the dielectric layer 211a, and the second conductive type well 203b.

In one preferred embodiment, the first conductive type LDD region 205a has an impurity concentration which is higher than an impurity concentration of the first conductive type well 203a, and the second conductive type LDD region 205b has an impurity concentration which is higher than an impurity concentration of the second conductive type well 203b. For example, the impurity concentration of the first conductive type LDD region 205a may be 2-10 folds of the impurity concentration of the first conductive type well 203a; the impurity concentration of the second conductive type LDD region 205b may be 2-10 folds of the impurity concentration of the second conductive type well 203b. The impurity concentration described above refers to a planar dopant concentration executed in an ion implantation process. Usually, after annealing process, a three-dimensional dopant concentration is formed and the three-dimensional dopant concentration is lower than the planar dopant concentration, as well-known by one skilled in the art. By the dopant concentration design in this embodiment, the HCE of the SCE can be alleviated.

Figure 3A:
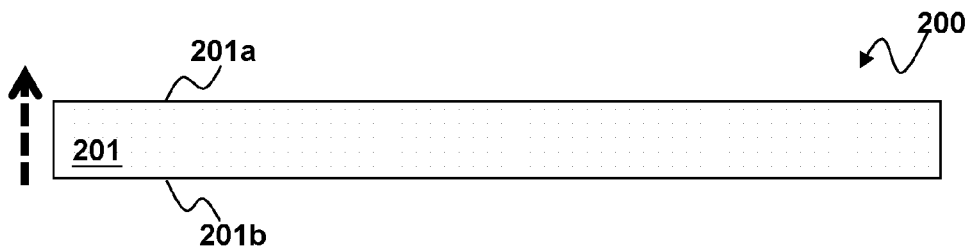
FIGS. 3A-3H show a second embodiment of the present invention.
Figure 3B:
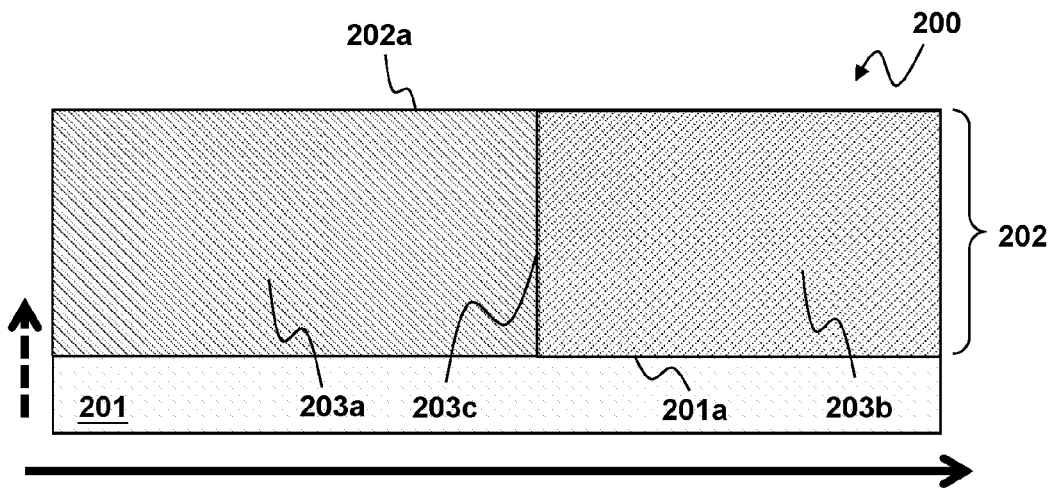

FIGS. 3A-3H show a second embodiment of the present invention. FIGS. 3A-3H show cross-section views according to a manufacturing method of the dual-well MOS device 200 of the present invention. As shown in FIG. 3A, a substrate 201 is provided, which is for example but not limited to a P-type substrate. The substrate 201 includes a top surface 201a and a bottom surface 201b opposite to the top surface 201a in a vertical direction (as shown by the dash arrow in the figure). Next, as shown in FIG. 3B, an epitaxial layer 202 is formed on and connects the top surface 201a of the substrate 201. The epitaxial layer 202 includes an epitaxial top surface 202a opposite to the top surface 201a in the vertical direction.

Next, still referring to FIG. 3B, a first conductive type well 203a is formed in the epitaxial layer 202. The first conductive type well 203a is stacked on the top surface 201a of the substrate 201 in the vertical direction, and the first conductive type well 203a is located under the epitaxial top surface 202a. A second conductive type well 203b is formed in the epitaxial layer 202 and located under the epitaxial top surface 202a in the vertical direction. The second conductive type well 203b connects the first conductive type well 203a in the lateral direction, to form a PN junction 203c between the first conductive type well 203a and the second conductive type well 203b. The PN junction 203c is also located between the first conductive type LDD region 204a and the second conductive type LDD region 204b which will be formed in later process steps. The first conductive type well 203a and the second conductive type well 203b can be formed by, for example but not limited to, processes including a lithography process, an ion implantation process, and a thermal process (not shown), which are well-known by one skilled in the art, and the details of these processes are not redundantly described herein.

Figure 3C:
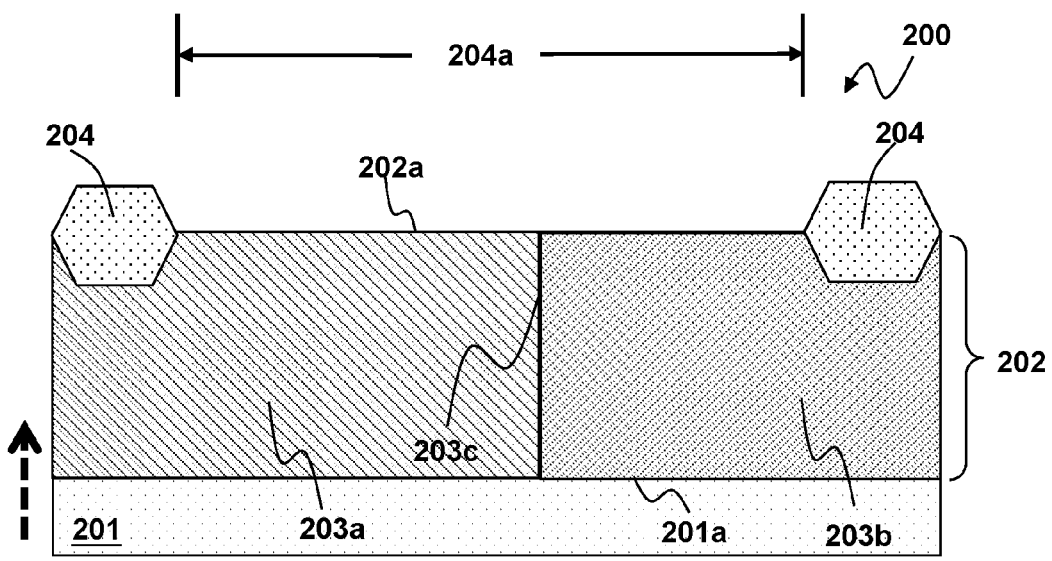
Figure 3D:
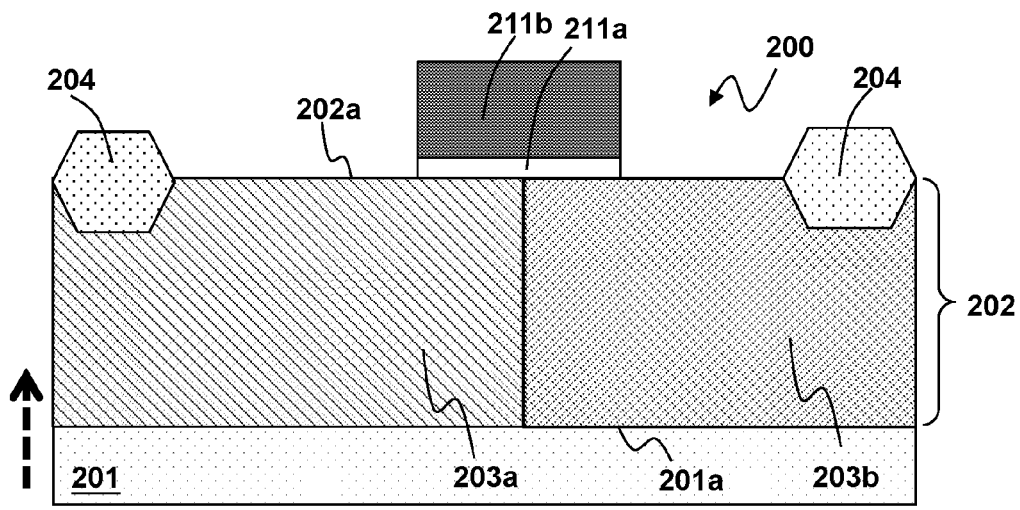

Next, referring to FIG. 3C, an isolation oxide region 204 is formed on the epitaxial layer 202, to define an operation region 204a. The first conductive type body region 208, the gate 211, the first conductive type LDD region 205a, the second conductive type LDD region 205b, the second conductive type source 206, and the second conductive type drain 207 which will be formed in later process steps are located in the operation region 204a. The isolation oxide region 204 for example can be formed by a local oxidation of silicon (LOCOS) process or by a shallow trench isolation (STI) process. In FIG. 3C, the isolation oxide region 204 has a LOCOS structure. In another embodiment which will be shown by FIG. 5, the isolation oxide region 204 has an STI structure. Next, as shown in FIG. 3D, the dielectric layer 211a and the gate conductive layer 211b are formed on the epitaxial top surface 202a. The dielectric layer 211a is stacked on and connects the epitaxial top surface 202a in the vertical direction, and the gate conductive layer 211b is stacked on and connects the dielectric layer 211a.

Figure 3E:
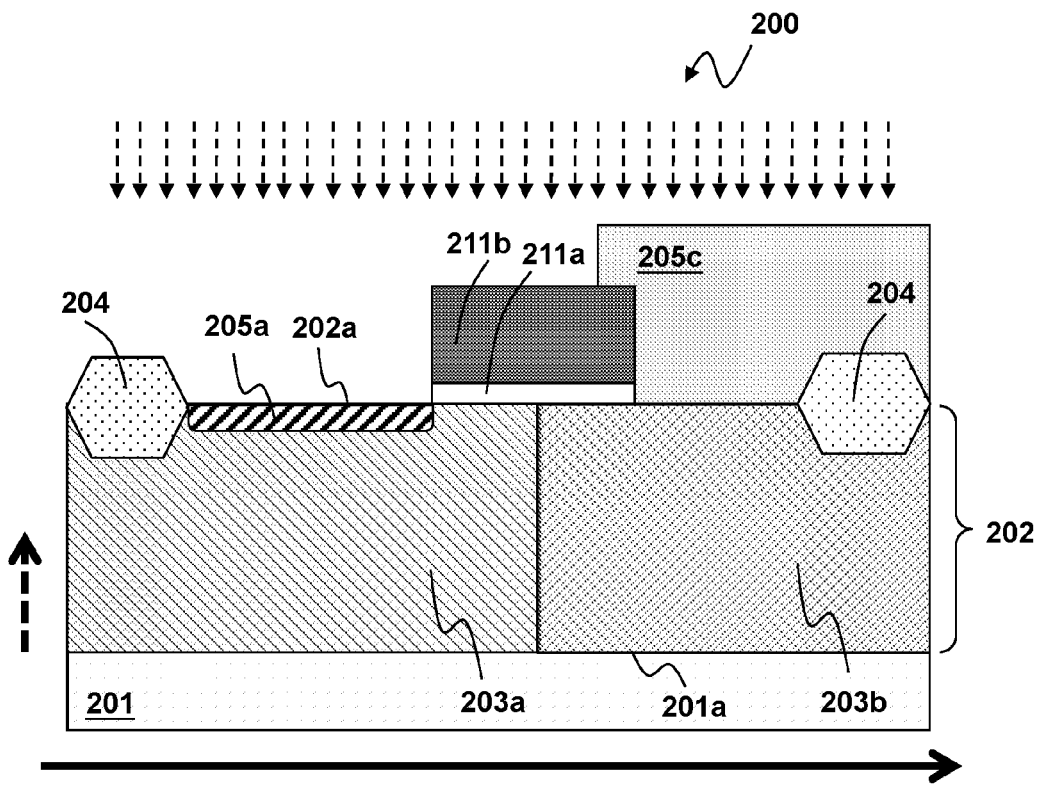
Figure 3F:
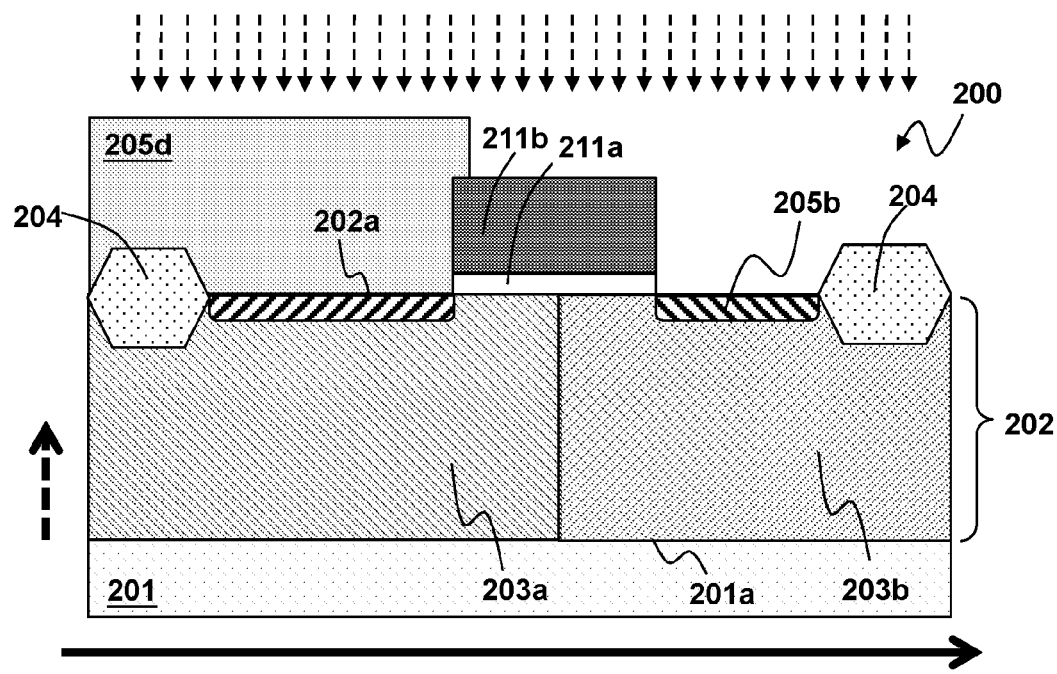

Next, as shown in FIG. 3E, an ion implantation region of the first conductive type LDD region 205a is defined by a mask including the dielectric layer 211a, the gate conductive layer 211b, and a photoresist layer 205c. First conductive type impurities are implanted into the defined ion implantation region by an ion implantation process. Next, as shown in FIG. 3F, an ion implantation region of the second conductive type LDD region 205b is defined by a mask including the dielectric layer 211a, the gate conductive layer 211b, and a photoresist layer 205d. Second conductive type impurities are implanted into the defined ion implantation region by another ion implantation process. Note that the sequence of the steps of FIGS. 3E and 3F is interchangeable.

Figure 3G:
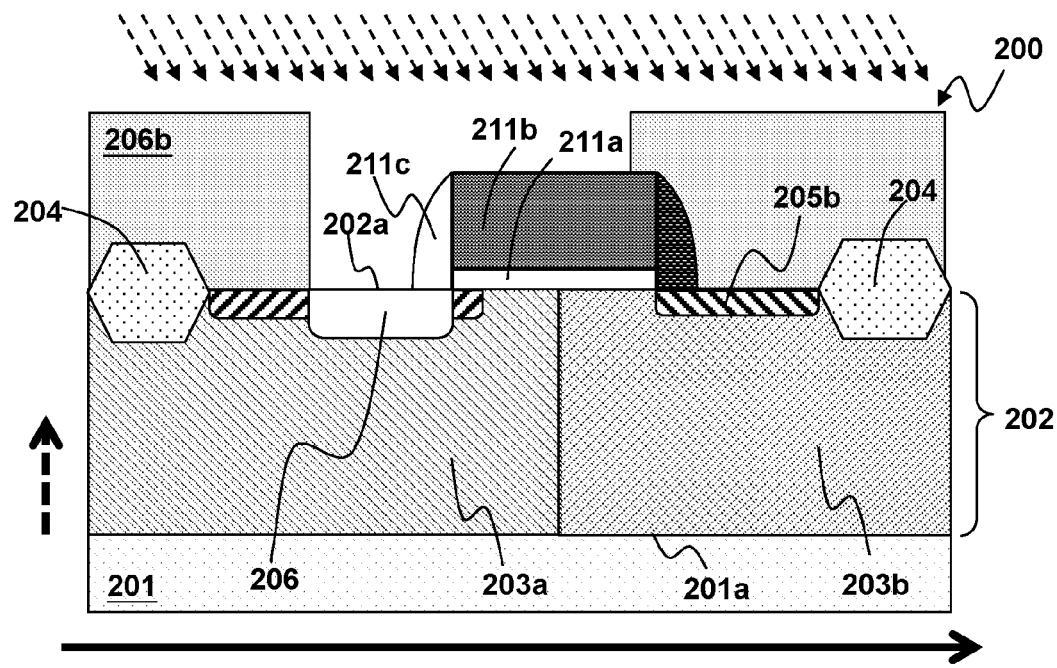

Next, as shown in FIG. 3G, a spacer layer 211c is formed, and the second conductive type source 206 is formed on the first conductive type well 203a in the epitaxial layer 202. The second conductive type source 206 is located between the epitaxial top surface 202a and the first conductive type well 203a in the vertical direction. Further, the second conductive type source 206 connects the first conductive type body region 208 and the first conductive type LDD region 205a in the lateral direction. In an ion implantation process for forming the second conductive type source 206 shown in FIG. 3G, an ion implantation region can be defined by a mask including the spacer layer 211c, the gate conductive layer 211b and the photoresist layer 206b. Second conductive type impurities are implanted into the defined ion implantation region to form the second conductive type source 206. Preferably, the ion implantation can be performed with a tilt angle with respect to the epitaxial top surface 202a, which is helpful in avoiding OFF-channel.

Figure 3H:
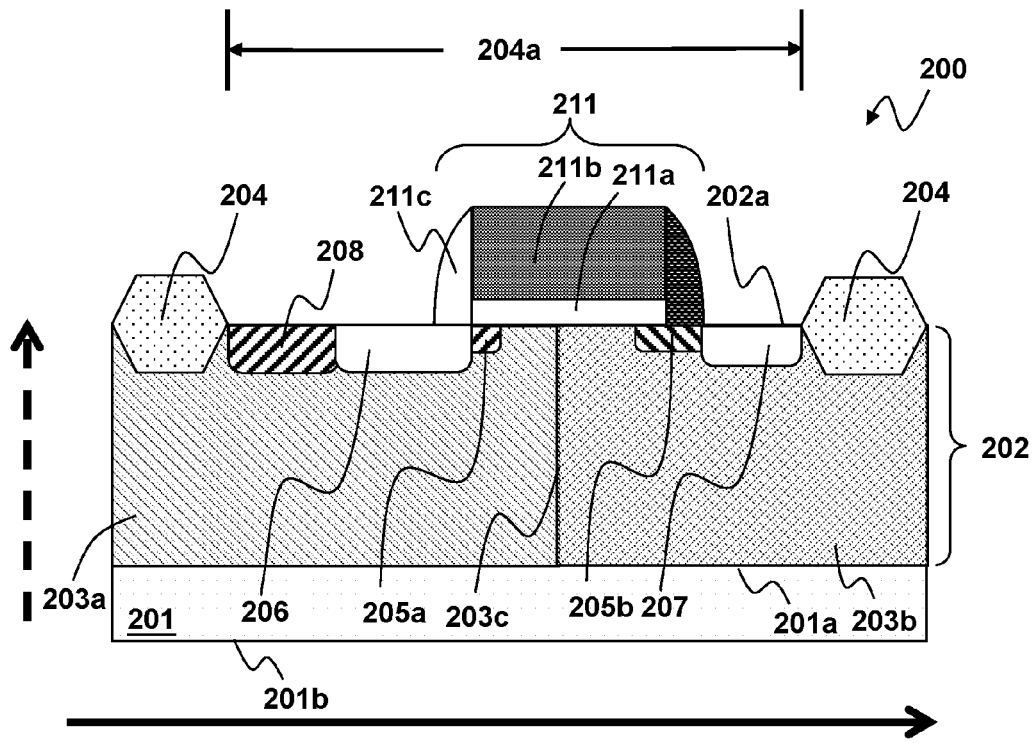

Next, as shown in FIG. 3H, the first conductive type body region 208 is formed on the first conductive type well 203a in the epitaxial layer 202. The first conductive type body region 208 is located between the first conductive type well 203a and the epitaxial top surface 202a in the vertical direction. And, the second conductive type drain 207 is formed on the second conductive type well 203b in the epitaxial layer 202. The second conductive type drain 207 is located between the epitaxial top surface 202 and the second conductive type well 203b in the vertical direction. The second conductive type drain 207 connects the second conductive type LDD region 205b in the lateral direction. The PN junction 203c is formed between the first conductive type LDD region 205a and the second conductive type LDD region 205b. In one embodiment, the ion implantation process for forming the second conductive type drain 207 and the ion implantation process step for forming the second conductive type source 206 can be integrated into one step.

In one preferred embodiment, the first conductive type LDD region 205a has an impurity concentration which is higher than an impurity concentration of the first conductive type well 203a, and the second conductive type LDD region 205b has an impurity concentration which is higher than an impurity concentration of the second conductive type well 203b. For example, the impurity concentration of the first conductive type LDD region 205a may be 2-10 folds of the impurity concentration of the first conductive type well 203a; the impurity concentration of the second conductive type LDD region 205b may be 2-10 folds of the impurity concentration of the second conductive type well 203b. The impurity concentration described above refers to a planar dopant concentration executed in an ion implantation process. Usually, after annealing process, a three-dimensional dopant concentration is formed and the three-dimensional dopant concentration is lower than the planar dopant concentration, as well-known by one skilled in the art. By the dopant concentration design in this embodiment, the HCE of the SCE can be alleviated.

Figure 4:
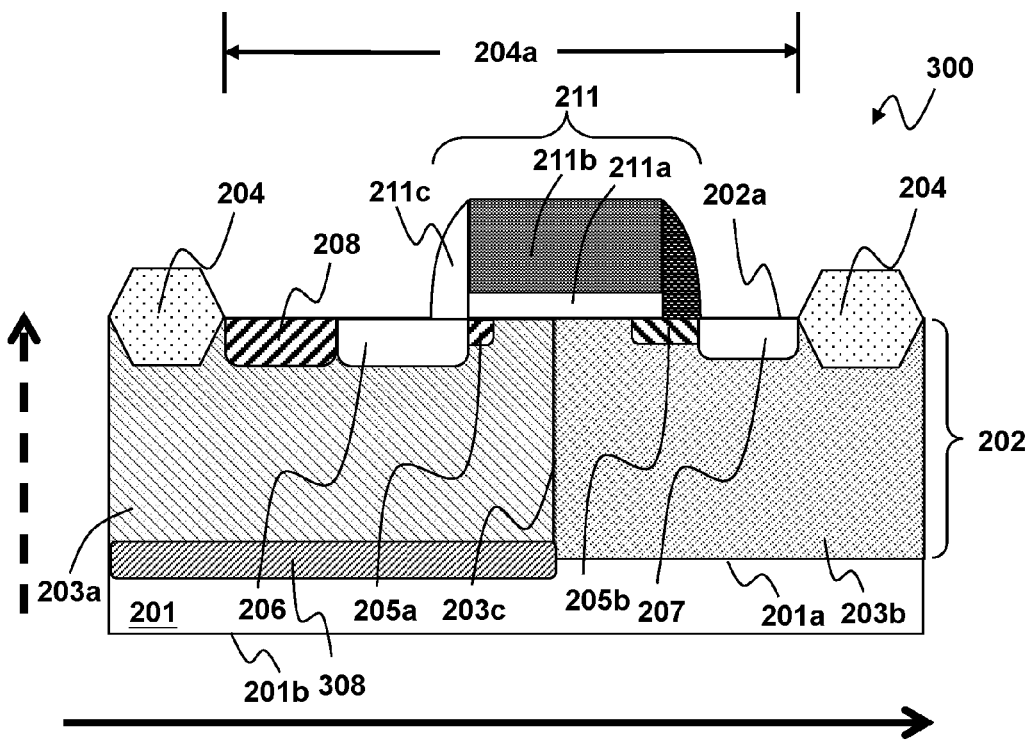
FIG. 4 shows a third embodiment of the present invention.

FIG. 4 shows a dual-well MOS device 300 according to a third embodiment of the present invention. Compared with the first embodiment, the dual-well MOS device 300 of this embodiment further includes a second conductive type buried layer 308, which is formed between the substrate 201 and the epitaxial layer 202. The second conductive type buried layer 308 upwardly connects the first conductive type well 203a in the vertical direction. The second conductive type buried layer 308 electrically separates the first conductive type well 203a from the substrate 201, such that the first conductive type well 203a does not directly contact the substrate 201 to avoid a possible error, especially when conductive type of the substrate 201 is P-type.

Figure 5:
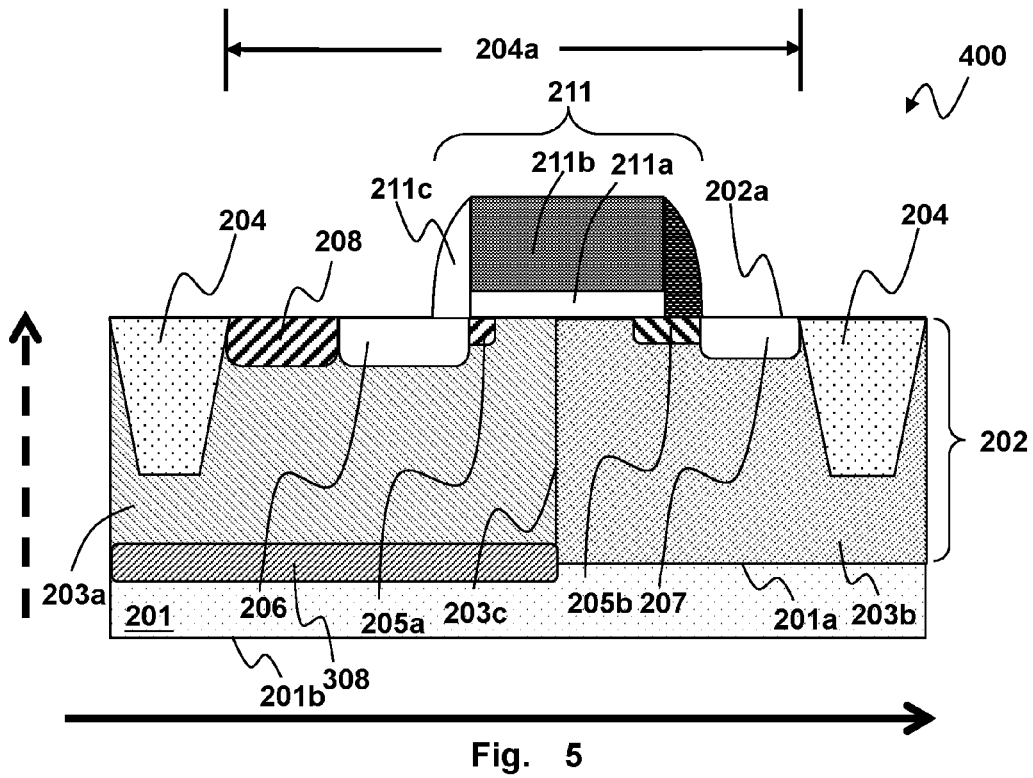
FIG. 5 shows a fourth embodiment of the present invention.

FIG. 5 shows a cross-section view of a dual-well MOS device 400 according to a fourth embodiment of the present invention. This embodiment shows another option for forming the isolation oxide region. As shown in FIG. 5, this embodiment is different from the first embodiment in that the isolation oxide region 204 is formed by a shallow trench isolation (STI) process. Except the isolation oxide region 204, the rest structure and manufacturing steps of the dual-well MOS device 400 are the same as the first embodiment.

Figure 6:
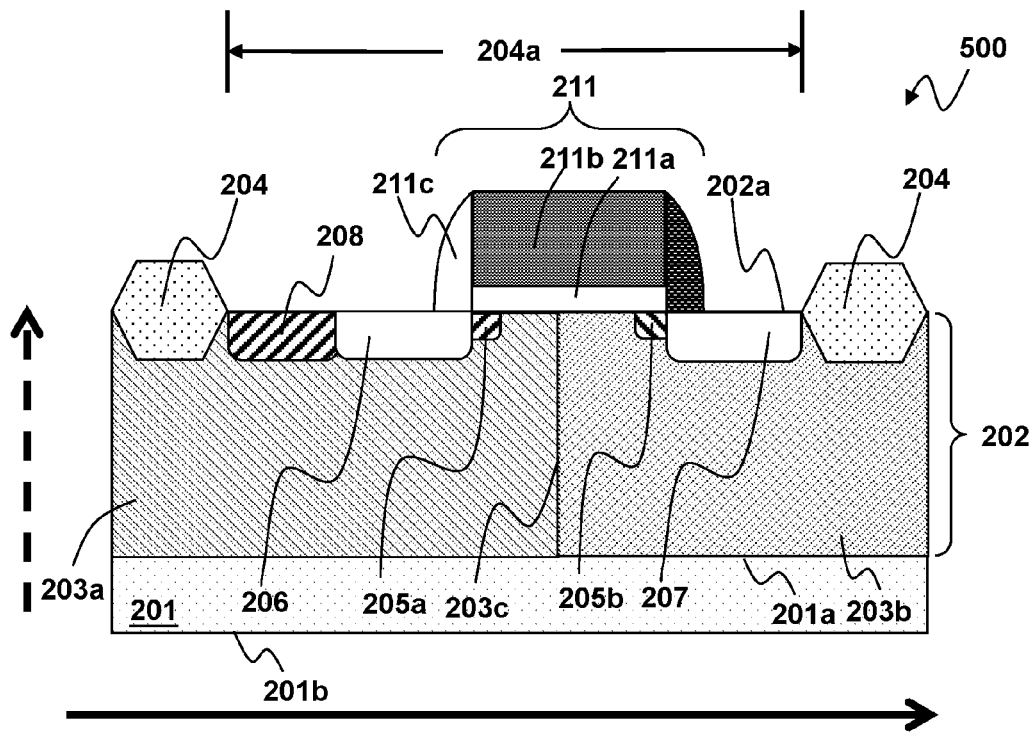
FIG. 6 shows a fifth embodiment of the present invention.

FIG. 6 shows a cross-section view of a dual-well MOS device 500 according to a fifth embodiment of the present invention. This embodiment illustrates that, in a preferred embodiment of the present invention, the ion implantation process step for forming the second conductive type drain 207 and the ion implantation process step for forming the second conductive type source 206 can be integrated into one step. In this embodiment, the second conductive type impurities for forming the second conductive type drain 207 are implanted by a way similar to forming the second conductive type source 206, with a tilt angle with respect to the epitaxial top surface 202a, such that some of the second conductive type impurities are implanted into the epitaxial layer 202 under the spacer layer 211c as shown in FIG. 6. This arrangement can reduce the manufacturing cost because it does not require a separate individual step for forming the second conductive type drain 207.

Figure 1:
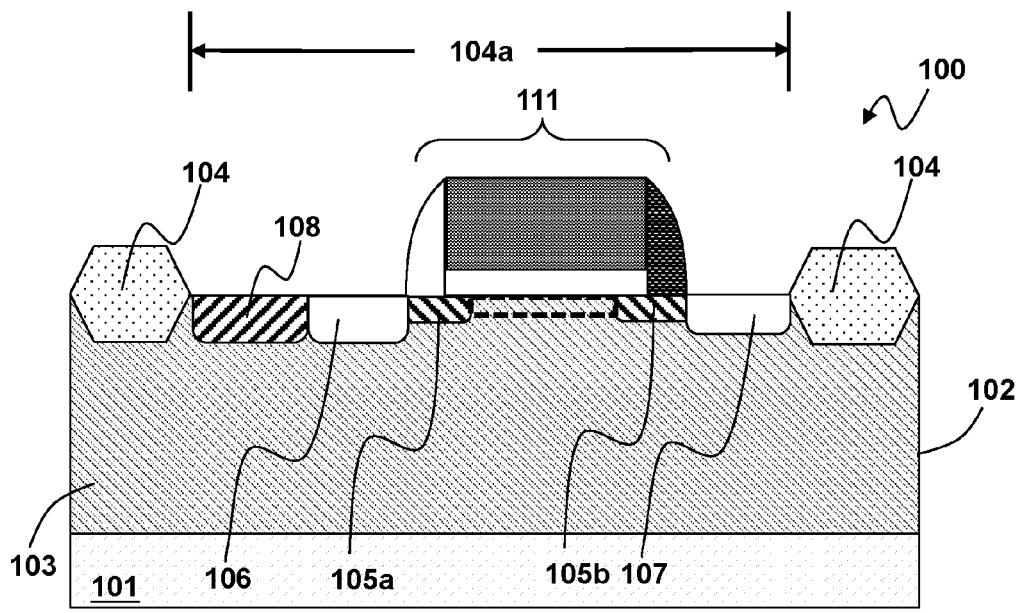
FIG. 1 show a prior art MOS device 100.

The present invention is different from the prior art in many aspects. There are at least three differences between the dual-well MOS device 200 of the present invention and the prior art MOS device 100 shown in FIG. 1, as follows:

1. The dual-well MOS device 200 includes two wells having different conductive types from each other. The first conductive type well 203a and the second conductive type source 206 are at the same side of the PN junction 203c; the second conductive type well 203b and the second conductive type drain 207 are at the same side of the PN junction 203c.

2. The dual-well MOS device 200 includes two LDD regions having different conductive types from each other. The first conductive type LDD region 205a and the first conductive type well 203a are at the same side of the PN junction 203c; the second conductive type LDD region 205b and the second conductive type well 203b are at the same side of the PN junction 203c.

3. The dual-well MOS device 200 includes the aforementioned PN junction 203c, which is formed by the first conductive type well 203a and the second conductive type well 203b, and the PN junction 203c is located between the first conductive type LDD region 205a and the second conductive type LDD region 205b.

In the prior art MOS device 100, when a bias voltage is applied to the gate 111, a channel is formed at the interface between the P-type well 103 and the dielectric layer of the gate 111 (as shown by the dash square in FIG. 1) to attract carriers. When the bias voltage changes, the number of the attracted carriers correspondingly changes, and the electrical field near the channel changes, whereby a current is generated and controlled, as well-known by one skilled in the art. However, in the dual-well MOS device 200 of the present invention, the channel is decided by the second conductive type source 206 and the second conductive type well 203b, which is different from the prior art MOS device 100 in which the channel is decided by the N-type LDD region 105a (same side as the N-type source 106) and the N-type LDD region 105b (same side as the N-type drain 107). The channel of the dual-well MOS device 200 is shown by the dash square in FIG. 2. To achieve the same electrical effect, the channel of the present invention is relatively shorter, so the conduction resistance through the channel is relatively lower. Besides, because the impurity concentration of the first conductive type LDD region 205a is higher than the impurity concentration of the first conductive type well 203a, the SCE is suppressed. Further, in the prior art MOS device 100, the breakdown occurs at the junction between the N-type LDD region 105b and the P-type well 103; because the impurity concentration of the N-type LDD region 105b is relatively high, the breakdown voltage is correspondingly low. In the dual-well MOS device 200 of the present invention, the breakdown occurs at the PN junction 203c; because the impurity concentration of the second conductive type well 203b is relatively low, the breakdown is correspondingly high, and the hot carrier effect is better suppressed.

Figure 7A:
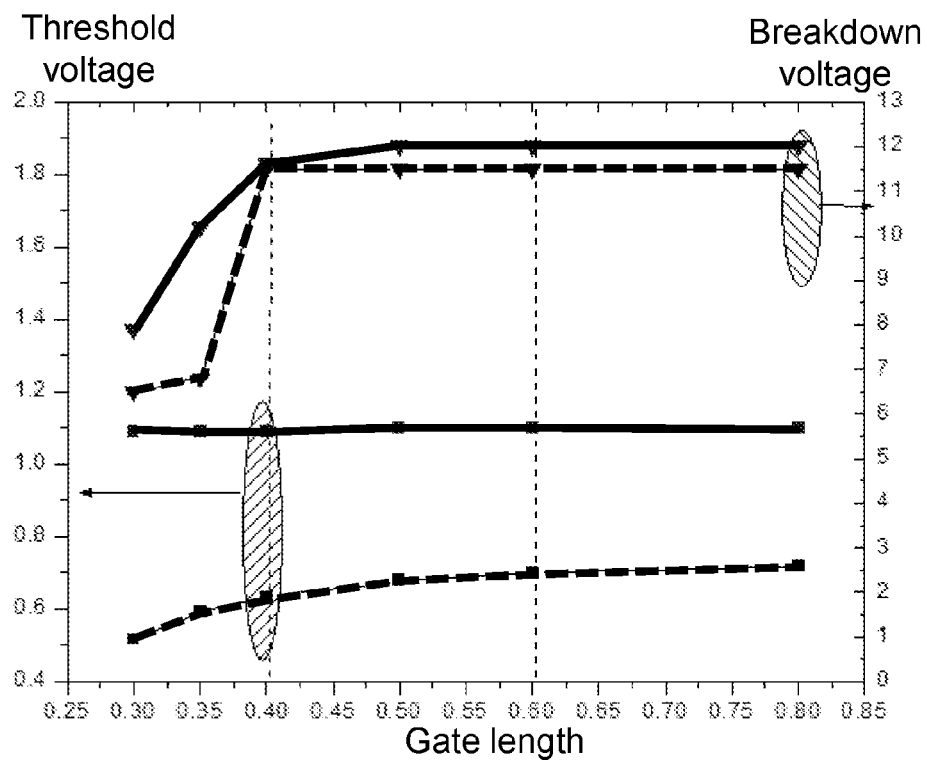
FIGS. 7A-7C show comparisons between characteristic curves of the prior art MOS device and the dual-well MOS device of the present invention.

FIG. 7A shows a comparison between characteristic curves of the prior art MOS device and the dual-well MOS device of the present invention. In FIG. 7A, the horizontal axis represents the gate lengths of the prior art MOS device and the dual-well MOS device of the present invention; the left vertical axis represents the threshold voltages of the prior art MOS device and the dual-well MOS device of the present invention; and the right vertical axis represents the breakdown voltages of the prior art MOS device and the dual-well MOS device of the present invention. The solid curves show characteristic curves corresponding to the dual-well MOS device of the present invention. The dash curves show characteristic curves corresponding to the prior art MOS device. As the curves clearly show, in the dual-well MOS device of the present invention, no DIBL occurs even when the gate length is shortened; the threshold voltage of the dual-well MOS device is substantially maintained at the same level; and the breakdown voltage of the dual-well MOS device is higher than the prior art MOS device. Thus, the dual-well MOS device of the present invention is superior to the prior art MOS device.

Figure 7B:
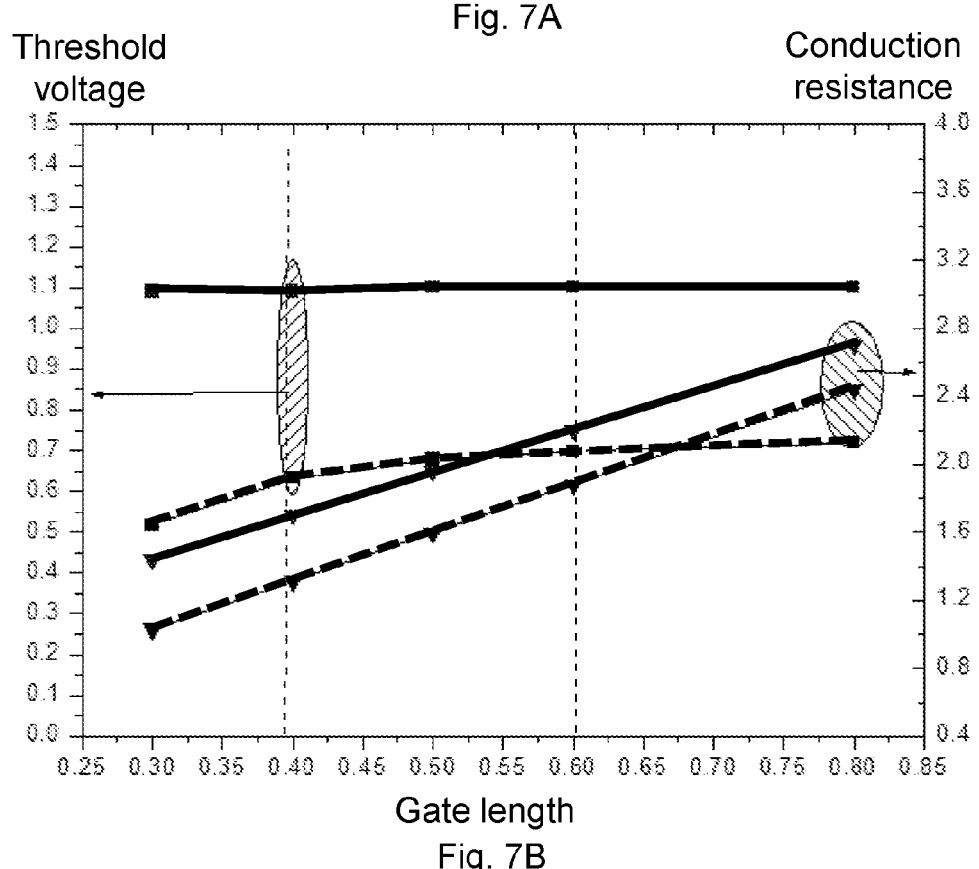

FIG. 7B shows another comparison between the characteristic curves of the prior art N-type MOS device and an N-type dual-well MOS device of the present invention. In FIG. 7B, the horizontal axis represents the gate lengths of the prior art N-type MOS device and the N-type dual-well MOS device of the present invention; the left vertical axis represents the threshold voltages of the prior art N-type MOS device and the N-type dual-well MOS device of the present invention; and the right vertical axis represents the conduction resistances of the prior art N-type MOS device and the N-type dual-well MOS device of the present invention. In the figure, the solid curves show characteristic curves corresponding to the N-type dual-well MOS device of the present invention; the dash curves show characteristic curves corresponding to the prior art N-type MOS device. As the curves clearly show, in the N-type dual-well MOS device of the present invention, no DIBL occurs even when the gate length is shortened, and the threshold voltage is substantially maintained at same level. However, when the gate length of the prior art N-type MOS device is shortened, the DIBL occurs and the threshold voltage decreases. Therefore, in order to maintain the gate operation voltage (for example, 5V), the gate length of the prior art N-type MOS device cannot be less than 0.6 µm. On the contrary, in the N-type dual-well MOS device of the present invention, the DIBL does not occur even when the gate length is shortened to 0.3 µm. In one embodiment, a preferred lower limit of the gate length of the N-type dual-well MOS device is 0.4 µm, to maintain a good breakdown voltage. As far as the SCE is concerned, the gate length of the present invention is shorter than the prior art while the SCE is avoided, so the conduction resistance is lower than the prior art. Furthermore, the dual-well MOS device of the present invention can have a smaller size and a reduced manufacturing cost. In view of the above, the dual-well MOS device of the present invention is superior to the prior art MOS device.

Figure 7C:
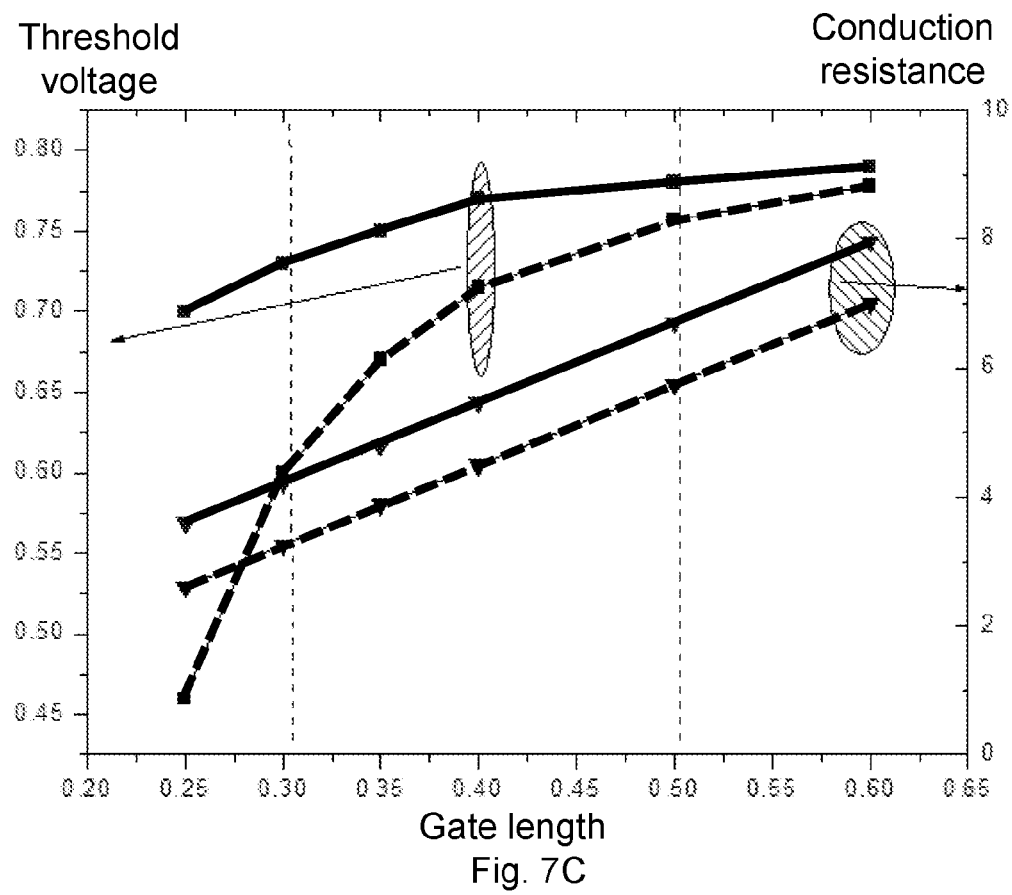

FIG. 7C shows yet another comparison between the characteristic curves of the prior art P-type MOS device and an P-type dual-well MOS device of the present invention. In FIG. 7C, the horizontal axis represents the gate lengths of the prior art P-type MOS device and the P-type dual-well MOS device of the present invention; the left vertical axis represents the threshold voltages of the prior art P-type MOS device and the P-type dual-well MOS device of the present invention; and the right vertical axis represents the conduction resistances of the prior art P-type MOS device and the P-type dual-well MOS device of the present invention. In the figure, the solid curves show characteristic curves corresponding to the P-type dual-well MOS device of the present invention. The dash curves show characteristic curves corresponding to the prior art P-type MOS device. As the gate length is shortened, in comparison with the prior art P-type MOS device, the DIBL of the P-type dual-well MOS device of the present invention is much less, and the threshold voltage of the present invention decreases slower than the prior art. In the prior art P-type MOS device, when the gate length of is shortened, a serious DIBL occurs and the threshold voltage decreases rapidly. Therefore, in order to maintain the gate operation voltage (for example, 5V), the gate length of the prior art P-type MOS device cannot be less than 0.6 µm. On the contrary, in the P-type dual-well MOS device of the present invention, the DIBL does not occur even when the gate length is shortened to 0.3 µm. In one embodiment, a preferred lower limit of the gate length of the P-type dual-well MOS device is 0.4 µm, to maintain a good breakdown voltage. As far as the SCE is concerned, the gate length of the present invention is shorter than the prior art while the SCE is avoided, so the conduction resistance is lower than the prior art. Furthermore, the dual-well MOS device of the present invention can have a smaller size and a reduced manufacturing cost. In view of the above, the dual-well MOS device of the present invention is superior to the prior art MOS device.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography or other lithography techniques. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A dual-well metal oxide semiconductor (MOS) device, comprising:
   a substrate, including a top surface and a bottom surface opposite to the top surface in a vertical direction;
   an epitaxial layer, which is formed on and connects at least a portion of the top surface of the substrate, the epitaxial layer including an epitaxial top surface opposite to the top surface in the vertical direction;
   a first conductive type well, which is formed in the epitaxial layer and located under the epitaxial top surface in the vertical direction;
   a first conductive type body region, which is formed on the first conductive type well in the epitaxial layer, and is located between the first conductive type well and the epitaxial top surface in the vertical direction;

a second conductive type well, which is formed in the epitaxial layer and located under the epitaxial top surface in the vertical direction, and connects the first conductive type well in a lateral direction, to form a PN junction between the first conductive type well and the second conductive type well;

a gate, which is stacked on and connects the epitaxial top surface in the vertical direction;

a first conductive type lightly doped diffusion (LDD) region, which is formed on the first conductive type well in the epitaxial layer, and is located between the epitaxial top surface and the first conductive type well in the vertical direction;

a second conductive type lightly doped diffusion (LDD) region, which is formed on the second conductive type well in the epitaxial layer, and is located between the epitaxial top surface and the second conductive type well in the vertical direction;

a second conductive type source, which is formed on the first conductive type well in the epitaxial layer, and is located between the epitaxial top surface and the first conductive type well in the vertical direction, wherein the second conductive type source connects the first conductive type body region and the first conductive type LDD region in the lateral direction; and a second conductive type drain, which is formed on the second conductive type well in the epitaxial layer, and is located between the epitaxial top surface and the second conductive type well in the vertical direction, wherein the second conductive type drain connects the second conductive type LDD region in the lateral direction;

wherein, the PN junction is located between the first conductive type LDD region and the second conductive type LDD region.

2. The dual-well MOS device of claim 1, further comprising an isolation oxide region, formed on the epitaxial layer, to define an operation region, wherein the first conductive type body region, the gate, the first conductive type LDD region, the second conductive type LDD region, the second conductive type source, and the second conductive type drain are located in the operation region.

3. The dual-well MOS device of claim 2, wherein the isolation oxide region includes a local oxidation of silicon (LOCOS) structure or a shallow trench isolation (STI) structure.

4. The dual-well MOS device of claim 1, wherein an impurity concentration of the first conductive type LDD region is higher than an impurity concentration of the first conductive type well, and an impurity concentration of the second conductive type LDD region is higher than an impurity concentration of the second conductive type well.

5. The dual-well MOS device of claim 1, further comprising a second conductive type buried layer, which is formed at or around an interface between the substrate and the epitaxial layer, the second conductive type buried layer upwardly connecting the first conductive type well in the vertical direction.

6. A manufacturing method of a dual-well metal oxide semiconductor (MOS) device, comprising:

providing a substrate, which includes a top surface and a bottom surface opposite to the top surface in a vertical direction;

forming an epitaxial layer, which is formed on and connects at least a portion of the top surface of the substrate, the epitaxial layer including an epitaxial top surface opposite to the top surface in the vertical direction;

forming a first conductive type well, which is formed in the epitaxial layer and located under the epitaxial top surface in the vertical direction;

forming a first conductive type body region, which is formed on the first conductive type well in the epitaxial layer, and is located between the first conductive type well and the epitaxial top surface in the vertical direction;

forming a second conductive type well, which is formed in the epitaxial layer and located under the epitaxial top surface in the vertical direction, and connects the first conductive type well in a lateral direction, to form a PN junction between the first conductive type well and the second conductive type well;

forming a gate, which is stacked on and connects the epitaxial top surface in the vertical direction;

forming a first conductive type lightly doped diffusion (LDD) region, which is formed on the first conductive type well in the epitaxial layer, and is located between the epitaxial top surface and the first conductive type well in the vertical direction;

forming a second conductive type lightly doped diffusion (LDD) region, which is formed on the second conductive type well in the epitaxial layer, and is located between the epitaxial top surface and the second conductive type well in the vertical direction;

forming a second conductive type source, which is formed on the first conductive type well in the epitaxial layer, and is located between the epitaxial top surface and the first conductive type well in the vertical direction, wherein the second conductive type source connects the first conductive type body region and the first conductive type LDD region in the lateral direction;

forming a second conductive type drain, which is formed on the second conductive type well in the epitaxial layer, and is located between the epitaxial top surface and the second conductive type well in the vertical direction, wherein the second conductive type drain connects the second conductive type LDD region in the lateral direction;

wherein the PN junction is located between the first conductive type LDD region and the second conductive type LDD region.

7. The manufacturing method of claim 6, further comprising: forming an isolation oxide region on the epitaxial layer, to define an operation region, wherein the first conductive type body region, the gate, the first conductive type LDD region, the second conductive type LDD region, the second conductive type source, and the second conductive type drain are located in the operation region.

8. The manufacturing method of claim 7, wherein the isolation oxide region includes a local oxidation of silicon (LOCOS) structure or a shallow trench isolation (STI) structure.

9. The manufacturing method of claim 6, wherein an impurity concentration of the first conductive type LDD region is higher than an impurity concentration of the first conductive type well, and an impurity concentration of the second conductive type LDD region is higher than an impurity concentration of the second conductive type well.

10. The manufacturing method of claim 6, further comprising: forming a second conductive type buried layer between the substrate and the epitaxial layer, wherein the second conductive type buried layer upwardly connects the first conductive type well in the vertical direction.

* * * * *